US011158756B2

(12) United States Patent
Reznicek et al.

(10) Patent No.: US 11,158,756 B2
(45) Date of Patent: Oct. 26, 2021

(54) FINFET RADIATION DOSIMETER

(71) Applicant: International Business Machines Corporation, Armonk, NY (US)

(72) Inventors: Alexander Reznicek, Troy, NY (US); Bahman Hekmatshoartabari, White Plains, NY (US); Jeng-Bang Yau, Yorktown Heights, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/572,102

(22) Filed: Sep. 16, 2019

(65) Prior Publication Data

US 2021/0083139 A1    Mar. 18, 2021

(51) Int. Cl.
| | |
|---|---|
| *H01L 31/119* | (2006.01) |
| *H05G 1/28* | (2006.01) |
| *G01T 1/02* | (2006.01) |
| *H01L 29/78* | (2006.01) |
| *H01L 21/02* | (2006.01) |
| *H01L 21/8234* | (2006.01) |
| *H01L 27/088* | (2006.01) |
| *H01L 29/06* | (2006.01) |
| *G01T 7/00* | (2006.01) |

(52) U.S. Cl.
CPC .......... *H01L 31/119* (2013.01); *G01T 1/026* (2013.01); *H01L 21/02164* (2013.01); *H01L 21/823431* (2013.01); *H01L 27/0886* (2013.01); *H01L 29/0657* (2013.01); *H01L 29/785* (2013.01); *H05G 1/28* (2013.01); *G01T 7/00* (2013.01); *H01L 29/0649* (2013.01); *H01L 2924/13067* (2013.01)

(58) Field of Classification Search
CPC .......... H01L 31/119; G01T 1/026; H05G 1/28
USPC .................................. 257/252, 428, E31.086
See application file for complete search history.

(56) References Cited

U.S. PATENT DOCUMENTS

| | | | | |
|---|---|---|---|---|
| 8,080,805 | B2 * | 12/2011 | Gordon | ................. H01L 31/119 250/370.09 |
| 8,361,829 | B1 * | 1/2013 | Gordon | ............... H01L 27/1203 438/57 |
| 8,476,683 | B2 | 7/2013 | Gordon et al. | |
| 9,405,017 | B2 | 8/2016 | Lin et al. | |

(Continued)

OTHER PUBLICATIONS

Schwank, J. R., "Radiation Effects in MOS Oxides", IEEE Transactions on Nuclear Science, Aug. 2008, pp. 1833-1853, vol. 55, No. 4.

(Continued)

*Primary Examiner* — Victoria K. Hall
(74) *Attorney, Agent, or Firm* — Scully, Scott, Murphy & Presser, P.C.; L. Jeffrey Kelly, Esq.

(57) ABSTRACT

A semiconductor radiation monitor (i.e., dosimeter) is provided that has an oxide charge storage region located on a first side of a semiconductor fin and a functional gate structure located on a second side of the semiconductor fin that is opposite the first side. Charges are created in the oxide charge storage region that is located on the first side of the semiconductor fin and detected on the second side of the semiconductor fin by the functional gate structure. Multiple semiconductor fins in parallel can form a dense and very sensitive semiconductor radiation monitor.

11 Claims, 8 Drawing Sheets

(56) References Cited

U.S. PATENT DOCUMENTS

| | | | |
|---|---|---|---|
| 9,659,979 B2 | 5/2017 | Gordon et al. | |
| 9,690,578 B2 | 6/2017 | Gill et al. | |
| 9,722,125 B1 * | 8/2017 | Cheng | H01L 29/0847 |
| 9,927,531 B2 | 3/2018 | Salasky et al. | |
| 10,020,416 B2 * | 7/2018 | Cheng | H01L 29/0847 |
| 10,347,784 B2 * | 7/2019 | Cheng | H01L 27/1443 |
| 10,957,707 B2 * | 3/2021 | Yau | H01L 27/11582 |
| 2011/0220805 A1 * | 9/2011 | Gordon | H01L 31/119 |
| | | | 250/370.09 |
| 2014/0088401 A1 * | 3/2014 | Cai | H01L 31/115 |
| | | | 600/407 |
| 2018/0006181 A1 * | 1/2018 | Cheng | H01L 31/18 |
| 2018/0145204 A1 * | 5/2018 | White | H01L 27/14696 |
| 2020/0343257 A1 * | 10/2020 | Yau | H01L 27/11573 |

OTHER PUBLICATIONS

Zhao, S. E., et al., "Gate Bias and Length Dependences of Total Ionizing Dose Effects in InGaAs FinFETs on Bulk Si", IEEE Transactions on Nuclear Science, Jul. 2019, pp. 1599-1605, vol. 66, No. 7.

* cited by examiner

FINFET RADIATION DOSIMETER

BACKGROUND

The present application relates to a radiation monitor and a method of forming the same. More particularly, the present application relates to a semiconductor radiation monitor (i.e., dosimeter) that includes an oxide charge storage region located on a first side of a semiconductor fin and a functional gate structure located on a second side of the semiconductor fin that is opposite the first side.

Radiation may come in various forms, including, for example, as X-rays, Y-rays, or beta-rays. There are various types of radiation monitors that may be used to determine an amount of radiation exposure, such as ionization detectors, Geiger counters, and thermoluminescent detectors (TLDs). Geiger counters and ionization detectors may determine and display a dose rate (for example, in mRad/hr) or an integrated dose (for example, in Rads) of radiation exposure in real time. Alarm set points may be programmed based on the dose rate or the integrated dose. A Geiger counter or ionization detector may communicate with a computer for data logging or firmware updates. However, Geiger counters and ionization detectors may be relatively expensive. TLDs allow determination of a dose of radiation based on emission of photons in response to application of heat. TLDs may be relatively inexpensive, but may only be read after a period of exposure time, typically between one and three months. A degree of radiation exposure may only be determined after-the-fact using a TLD; real time dose information is not available.

One type of semiconductor radiation monitoring device may include a p-channel metal-oxide-semiconductor field effect transistor (MOSFET) transistor structure having a gate oxide layer fabricated on bulk silicon. Holes may be induced in the FET structure by ionizing radiation exposure and trapped in the gate oxide by a voltage applied to the gate, and the threshold voltage ($V_{th}$) of the transistor may change according to the amount of trapped holes. However, in order to measure the change in $V_{th}$, a negative voltage is applied to the gate, which may trigger the release of the holes trapped in the gate oxide via direct or trap-assisted tunneling. Therefore, electrical readout of the $V_{th}$ shift to determine the radiation dose in such a FET-type dosimeter may cause a loss of the radiation-induced charge, leading to incorrect long-term total dose data. Further, the trapping voltage and the readout voltage are both applied at the gate, they may not be applied at the same time, so real-time information regarding a dose of radiation may not be obtained.

Another type of semiconductor radiation monitoring device includes a fully depleted semiconductor-on-insulator (FDSOI) dosimeter. One example of an FDSOI dosimeter includes a buried insulator layer disposed on a semiconductor substrate, the buried insulator layer including a plurality of charge traps. A semiconductor layer is disposed on the buried insulating layer. A second insulator layer is disposed on the semiconductor layer. A gate conducting layer is disposed on the second insulator layer, and one or more side contacts are electrically connected to the semiconductor layer. A back contact is electrically connected to the semiconductor substrate, the back contact configured to receive a backgate voltage during a radiation exposure by the radiation monitor. The backgate voltage includes a positive bias across the buried insulator layer that is configured to trap an amount of positive charge in the charge traps in the buried insulator layer in response to the radiation exposure by the radiation monitor, wherein the amount of positive charge trapped in the charge traps in the buried insulator layer is used to determine the amount of the radiation exposure. The FDSOI dosimeter is capable of real time readout, with retention, but is limited in density due to its planar structure and detection of lower dose (equal to, or less than, 100 Rad) at the expense of larger device area.

There is thus a need for providing a semiconductor radiation monitor that is capable of real time readout, with retention, but overcomes the aforementioned drawbacks of prior art FDSOI dosimeters.

SUMMARY

A semiconductor radiation monitor (i.e., dosimeter) is provided that has an oxide charge storage region located on a first side of a semiconductor fin and a functional gate structure located on a second side of the semiconductor fin that is opposite the first side. Charges are created in the oxide charge storage region that is located on the first side of the semiconductor fin and detected on the second side of the semiconductor fin by the functional gate structure. Multiple semiconductor fins in parallel can form a dense and very sensitive semiconductor radiation monitor. The finFET radiation monitor of the present application is capable of real time readout, with retention, and can detect a low dose of radiation (equal to, or less than, 100 Rad).

In one aspect of the present application, a semiconductor radiation monitor (i.e., dosimeter) is provided. In one embodiment, the semiconductor radiation monitor includes a semiconductor fin having a first sidewall and a second sidewall opposite the first sidewall. An oxide charge storage region is located laterally adjacent to, and contacting, the first sidewall of the semiconductor fin. A first portion of a functional gate structure is located laterally adjacent to, and contacting, the second sidewall of the semiconductor fin.

In some embodiments, another semiconductor fin is present and is spaced apart from the semiconductor fin. The another semiconductor fin has a first sidewall and a second sidewall opposite the first sidewall. In such an embodiment, the oxide charge storage region is located laterally adjacent to, and contacting, the first sidewall of the another semiconductor fin, and a second portion of the functional gate structure is located laterally adjacent to, and contacting the second sidewall of the another semiconductor fin.

In another aspect of the present application, a method of forming a semiconductor radiation monitor (i.e., dosimeter) is provided. In one embodiment, the method includes forming at least one semiconductor fin on a surface of a punch through stop (PTS) semiconductor material layer. The PTS semiconductor material layer that is located adjacent to the at least one semiconductor fin is then recessed such that the at least one semiconductor fin is present on a mesa portion of the PTS semiconductor material layer. An oxide material is then formed on a recessed surface of the PTS semiconductor material layer and laterally adjacent to a first side and a second side of the at least one semiconductor fin, the second side is opposite the first side. The oxide material that is located on the first side of the at least one semiconductor fin is selectively recessed to provide a local isolation region, while maintaining an entirety of the oxide material on the second side of the at least one semiconductor fin. A functional gate structure is then formed on the local isolation region and above the at least one semiconductor fin and the oxide material that is present on the second side of the at least one semiconductor fin.

In another embodiment of the present application, the method includes forming at least one pair of semiconductor fins on a surface of a punch through stop (PTS) semiconductor material layer. Next, the PTS semiconductor material layer that is located adjacent to the at least one pair of semiconductor fins is recessed such that each semiconductor fin of the at least one pair of semiconductor fins is present on a mesa portion of the PTS semiconductor material layer. An oxide material is then formed on a recessed surface of the PTS semiconductor material layer and laterally adjacent to, and between, the at least one pair of semiconductor fins. A dielectric hard mask is then formed on the oxide material that is located between the at least one pair of semiconductor fins. Next, the oxide material not protected by the dielectric hard mask is recessed to provide a local isolation region, and thereafter the dielectric hard mask is removed. A functional gate structure is then formed on the local isolation region and above the at least one pair of semiconductor fins.

DETAILED DESCRIPTION

Figure 1:
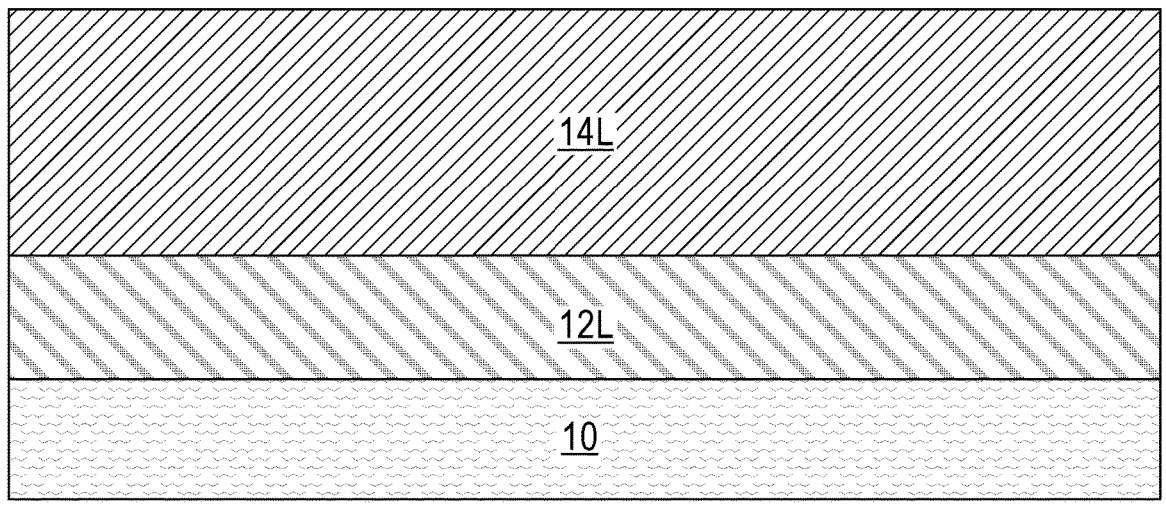
FIG. 1 is a cross sectional view of an exemplary structure that can be employed in accordance with an embodiment of the present application, the exemplary semiconductor structure including a base semiconductor substrate, a punch through stop (PTS) semiconductor material layer located on the base semiconductor substrate, and a semiconductor material layer located on the PTS semiconductor material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. The exemplary structure illustrated in FIG. 1 includes a base semiconductor substrate 10, a punch through stop (PTS) semiconductor material layer 12L located on the base semiconductor substrate 10, and a semiconductor material layer 14L located on the PTS semiconductor material layer 12L.

The base semiconductor substrate 10 that is employed in the present application includes a semiconductor material that has semiconducting properties. The semiconductor material that provides the base semiconductor substrate 10 can include, but is not limited to, silicon (Si), germanium (Ge), a silicon germanium alloy (SiGe), silicon carbide (SiC), silicon germanium carbide (SiGeC), III-V compound semiconductors or II-VI compound semiconductors. In some embodiments, the base semiconductor substrate 10 is composed of a single semiconductor material. In another embodiment, the base semiconductor substrate 10 can be composed of at least two semiconductor materials that are stacked one atop the other.

In one embodiment, the base semiconductor substrate 10 is a bulk semiconductor substrate. By "bulk" it is meant that the base semiconductor substrate 10 is entirely composed of at least one semiconductor material, as defined above. In one example, the base semiconductor substrate 10 can be entirely composed of silicon. In some embodiments, the bulk semiconductor substrate can include a multilayered semiconductor material stack including at least two different semiconductor materials, as defined above.

In another embodiment, the base semiconductor substrate 10 can comprise a topmost semiconductor material layer of a semiconductor-on-insulator (SOI) substrate. The top semiconductor material layer of the SOI substrate can include one of the semiconductor materials mentioned above. In one example, the topmost semiconductor material layer of the SOI substrate can be composed of silicon. The SOI substrate would also include, from bottom to top, an optional handle substrate (not shown) and an insulator layer (not shown). The handle substrate can include one of the above mentioned semiconductor materials or a non-semiconductor material such as a dielectric material or a conductive material. The insulator layer can include a buried oxide and/or a buried nitride.

In any of the above embodiments, the semiconductor material that provides the base semiconductor substrate 10 can be a single crystalline semiconductor material. The semiconductor material that provides the base semiconductor substrate 10 can have any of the well known crystal orientations. For example, the crystal orientation of the base semiconductor substrate 10 can be {100}, {110}, or {111}. Other crystallographic orientations besides those specifically mentioned can also be used in the present application.

The punch through stop semiconductor material layer 12L, which is continuously present on the entirety of the base semiconductor substrate 10, is composed of a first semiconductor material of a first conductivity type. The first semiconductor material that provides the punch through stop semiconductor material layer 12L can include one of the semiconductor materials mentioned above for providing the base semiconductor substrate 10. In one embodiment, the first semiconductor material that provides the punch through stop semiconductor material layer 12L is composed of a compositionally same semiconductor material as the base semiconductor substrate 10. For example, the base semiconductor substrate 10 and the first semiconductor material that provides the punch through stop semiconductor material layer 12L can be both composed of silicon. In yet another embodiment, the first semiconductor material that provides the punch through stop semiconductor material layer 12L is composed of a semiconductor material that is compositionally different from the base semiconductor substrate 10. For example, the base semiconductor substrate 10 can be composed of silicon, while the first semiconductor material that provides the punch through stop semiconductor material layer 12L can be composed of germanium.

The first conductivity type of the first semiconductor material that provides the punch through stop semiconductor material layer 12L can be provided by a p-type or n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment of the present application, the concentration of n-type or p-type dopant within the first semiconductor material that provides the punch through stop semiconductor material layer 12L can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. In one embodiment, the doping within the first semiconductor material that provides the punch through stop semiconductor material layer 12L can be uniform (i.e., have a uniform distribution of dopants throughout the entire region). In another embodiment, the doping within the first semiconductor material that provides punch through stop semiconductor material layer 12L can be graded.

In one embodiment of the present application, the punch through stop semiconductor material layer 12L can have a thickness from 20 nm to 100 nm. Other thicknesses that are lesser than, or greater than, the aforementioned thickness range can also be employed as the thickness of the punch through stop semiconductor material layer 12L.

The semiconductor material layer 14L, which is continuously present on the entirety of the punch through stop semiconductor material layer 12L, is composed of a second semiconductor material. The second semiconductor material that provides the semiconductor material layer 14L can include one of the semiconductor materials mentioned above for providing the base semiconductor substrate 10. In one embodiment, the second semiconductor material that provides the semiconductor material layer 14L is composed of a compositionally same semiconductor material as the base semiconductor substrate 10 and/or the first semiconductor material that provides the punch through stop semiconductor material layer 12L. For example, the base semiconductor substrate 10, the first semiconductor material that provides the punch through stop semiconductor material layer 12L and the second semiconductor material that provides the semiconductor material layer 14L can all be composed of silicon. In yet another embodiment, the second semiconductor material that provides the semiconductor material layer 14L is composed of a semiconductor material that is compositionally different from the base semiconductor substrate 10 and/or the second semiconductor material that provides the punch through stop semiconductor material layer 12L. For example, the base semiconductor substrate 10 can be composed of silicon, the first semiconductor material that provides the punch through stop semiconductor material layer 12L can be composed of germanium, and the second semiconductor material that provides the semiconductor material layer 14L can be composed of a silicon germanium alloy.

In some embodiments, the semiconductor material layer 14L may be an intrinsic semiconductor material layer. In other embodiments, the semiconductor material layer 14L may be a doped semiconductor material layer. When doped, the semiconductor material layer 14L is of a second conductivity type which can be the same as, or different from, the first conductivity type mentioned above for the punch through stop semiconductor material layer 12L. When doped, the concentration of dopant which the semiconductor material layer 14L is typically less than the dopant concentration of the punch through stop semiconductor material layer 12L.

In one embodiment of the present application, the exemplary structure of FIG. 1 including the base semiconductor substrate 10, the punch through stop semiconductor material layer 12L, and the semiconductor material layer 14L can be formed by first providing the base semiconductor substrate 10. An epitaxial growth (or deposition) process can then be employed to form the punch through stop semiconductor material layer 12L and the semiconductor material layer 14L.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In such an embodiment, and since an epitaxial growth process is used in providing the punch through stop semiconductor material layer 12L and the semiconductor material layer 14L, the punch through stop semiconductor material layer 12L and the semiconductor material layer 14L have an epitaxial relationship with each other as well with the base semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition can result in crystal defects and film cracking. The epitaxial growth of the punch through stop material layer 12L and the semiconductor material layer 14L can be performed utilizing any well known precursor gas or gas mixture. Carrier gases like hydrogen, nitrogen, helium and argon can be used. In some embodiments, a dopant that provides the specific conductivity type to the punch through stop semiconductor material layer 12L and, if applicable, the semiconductor material layer 14L can be introduced in-situ into the precursor gas or gas mixture that provides the first semiconductor material that provides the punch through stop semiconductor material layer 12L and the second semiconductor material that provides the semiconductor material layer 14L. In another embodiment, a dopant that provides the specific conductivity type can be introduced into an intrinsic first semiconductor material or an intrinsic second semiconductor material by ion implantation or gas phase doping.

In another embodiment of the present application, the base semiconductor substrate 10, the punch through stop semiconductor material layer 12L and the semiconductor material layer 14L are formed by first providing the base semiconductor substrate 10. Dopants that provide the specific conductivity type of the first semiconductor material that provides the punch through stop semiconductor material layer 12L can then be introduced into base semiconductor substrate 10 by ion implantation or gas phase doping. The semiconductor material layer 14L can then be epitaxially grown on the punch through stop semiconductor material layer 12L.

In yet another embodiment of the present application, the base semiconductor substrate 10, the punch through stop semiconductor material layer 12L and the semiconductor material layer 14L can be formed utilizing a wafer bonding process.

In some embodiments (not shown), a dielectric hard mask layer is disposed on the semiconductor material layer 14L. When present, the dielectric hard mask layer is composed of a dielectric hard mask material such as, for example, a silicon nitride or silicon oxynitride. The dielectric hard mask layer can be formed utilizing a conventional deposition process. The dielectric hard mask layer can have a thickness from 20 nm to 100 nm; although other thicknesses are contemplated and can be used as the thickness of the dielectric hard mask layer.

Figure 2:
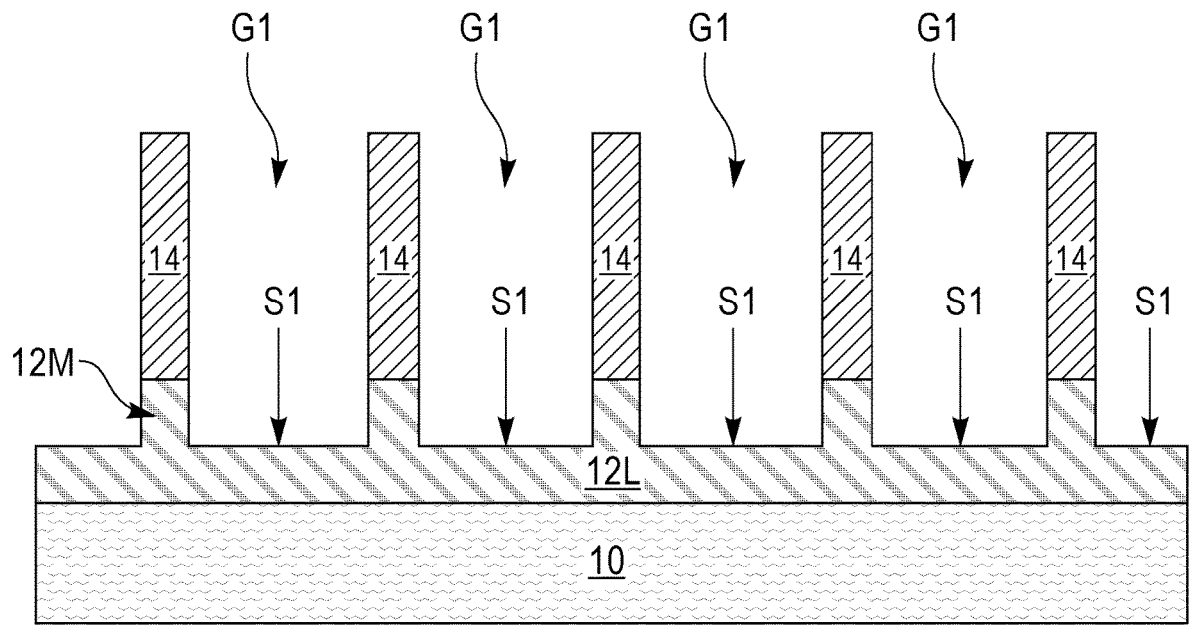
FIG. 2 is a cross sectional view of the exemplary structure of FIG. 1 after patterning the semiconductor material layer to provide a plurality of semiconductor fins, and recessing the PTS semiconductor material layer that is located between each semiconductor fin of the plurality of semiconductor fins.

Referring now to FIG. 2, there is illustrated the exemplary structure of FIG. 1 after patterning the semiconductor material layer 14L to provide a plurality of semiconductor fins 14, and recessing the punch through stop semiconductor material layer 12L that is located between each semiconductor fin of the plurality of semiconductor fins 14. Although a plurality of semiconductor fins 14 is described and illustrated, the present application works when a single semiconductor fin 14 is formed. As known to those skilled, a portion of the semiconductor fin 14 in which a functional gate structure is formed thereon will be used as a channel region, and other portions of the semiconductor fin 14 can be used as the source/drain regions.

In embodiments in which a dielectric hard mask layer is present on the semiconductor material layer 14L, the patterning used in forming the semiconductor fins 14 would also pattern the dielectric hard mask layer such that a hard mask cap (not shown) is present on a topmost surface of each of the semiconductor fins 14. When present, the hard mask caps have outermost sidewall surfaces that are vertically aligned to outermost sidewall surfaces of the semiconductor fins 14. Each semiconductor fin 14 is spaced apart from a nearest neighboring semiconductor fin 14 by a gap, G1.

The term "semiconductor fin" refers to a semiconductor material structure that includes a pair of vertical sidewalls that are parallel to each other. As used herein, a surface is "vertical" if there exists a vertical plane from which the surface does not deviate by more than three times the root mean square roughness of the surface. The number of semiconductor fins 14 that are formed can vary as long as at least one semiconductor fin 14 is formed. Each semiconductor fin 14 is composed of a non-etched portion of the semiconductor material layer 14L that remains after patterning. In one embodiment of the present application, each semiconductor fin 14 has a height from 20 nm to 200 nm, a width from 5 nm to 30 nm, and a length from 30 nm to 250 nm. Other heights and/or widths and/or lengths that are lesser than, or greater than, the ranges mentioned herein can also be used in the present application. When multiple semiconductor fins 14 are formed, each semiconductor fin 14 is spaced apart from its nearest neighboring semiconductor fin 14 by a pitch of from 20 nm to 100 nm. Also, each semiconductor fin 14 is oriented parallel to each other.

In one embodiment, patterning of the semiconductor material layer 14L may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used in providing the semiconductor fins 14.

In another embodiment, patterning of the semiconductor material layer 14L may include a sidewall image transfer (SIT) process. The SIT process includes forming a mandrel material layer (not shown) atop the material or material layers that are to be patterned. The mandrel material layer (not shown) can be composed of any material (semiconductor, dielectric or conductive) that can be selectively removed from the structure during a subsequently performed etching process. In one embodiment, the mandrel material layer (not shown) can be composed of amorphous silicon or polysilicon. In another embodiment, the mandrel material layer (not shown) can be composed of a metal such as, for example, Al, W, or Cu. The mandrel material layer (not shown) can be formed, for example, by chemical vapor deposition (CVD) or plasma enhanced chemical vapor deposition (PECVD). Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material can be composed of a material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet other embodiments, patterning of the semiconductor material layer 14L can include a direct self-assembly (DSA) process. In a DSA process, copolymer materials self-assemble to form nanoscale resolution patterns. In some embodiments, the nanoscale resolution patterns are from 10 nm to less than 50 nm.

After providing the semiconductor fins 14, physically exposed portions of the punch through stop semiconductor material layer 12L are thereafter recessed to provide the structure shown in FIG. 2. The recessing can be performed utilizing a recess etching process that is selective in removing the first semiconductor material that provides the punch through stop semiconductor material layer 12L. Typically, a hard mask cap is present on each semiconductor fin 14 thus the semiconductor fins 14 are not recessed during the recessing etch.

In FIG. 2, each semiconductor fin 14 is located on a surface of a mesa (or pedestal) portion 12M of the punch through stop semiconductor material layer 12L. Each mesa portion 12M has sidewall surfaces that are vertically aligned to outermost sidewalls of one of underlying semiconductor fins 14. Each mesa portion 12M is a non-recessed portion of the punch through stop semiconductor material layer 12L.

After recessing, the punch through stop semiconductor material layer 12L that remains between each of the semiconductor fins 14 has a recessed surface, S1, that is physically exposed and is located beneath a topmost surface of each mesa portion 12M of the punch through stop semiconductor material layer 12L.

Figure 3:
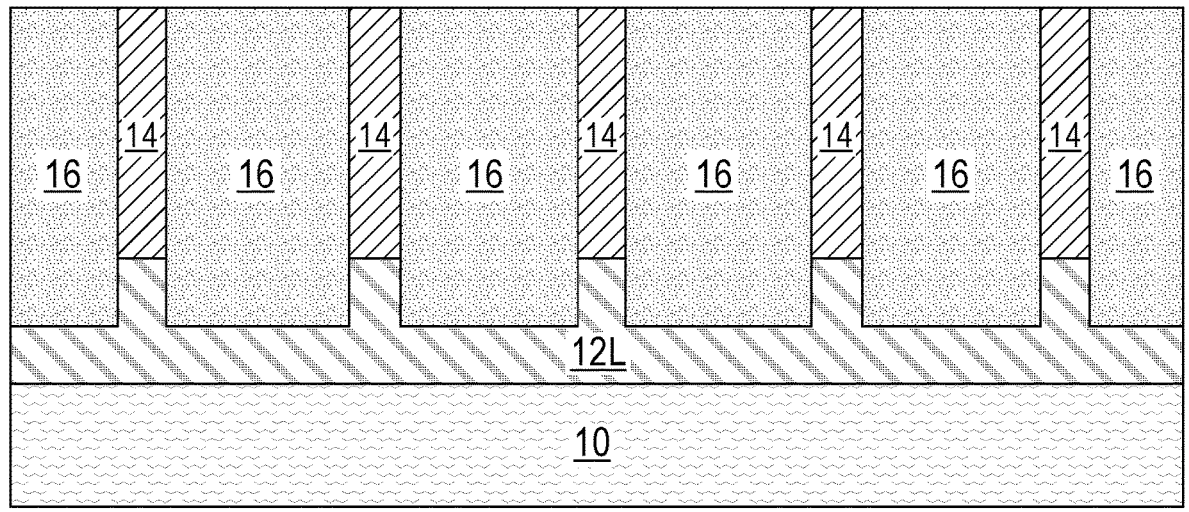
FIG. 3 is a cross sectional view of the exemplary structure of FIG. 2 after forming an oxide material on the recessed surface of the PTS semiconductor material layer and in gaps that are located laterally adjacent to, and between, each semiconductor fin of the plurality of semiconductor fins.

Referring now to FIG. 3, there is illustrated the exemplary structure of FIG. 2 after forming an oxide material 16 on the recessed surface, S1, of the PTS semiconductor material layer 12L and in gaps, G1, that are located laterally adjacent to, and between, each semiconductor fin 14 of the plurality of semiconductor fins 14. In some embodiments, the hard mask cap mentioned above is present on each semiconductor fin 14 during this step of the present application.

The oxide material 16 can be formed by filling the gaps, G1, that are located laterally adjacent to, and between, each of the semiconductor fins 14 with a trench dielectric oxide material such as, for example, silicon dioxide. The oxide material 16 is formed on a first side and a second side, opposite the first side, of each semiconductor fin 14. The filling of gaps within the oxide material 16 includes a deposition process such as, for example, chemical vapor deposition (CVD) or plasma enhanced chemical vapor deposition (PECVD). In some embodiments, the as deposited trench dielectric material can be subjected to a densification anneal process. When the densification anneal is employed, the densification anneal can be performed at a temperature from 250° C. to 1050° C. in an inert ambient such as, for example, helium, argon, forming gas or nitrogen. Following deposition and the optional densification anneal, a planarization process such as, for example, chemical mechanical polishing (CMP) and/or grinding, can be used to provide an oxide material 16 having a planar topmost surface. In some embodiments, the planar topmost surface of the oxide material 16 is coplanar with a topmost surface of the hard mask caps that are located on each semiconductor fin 14. In other embodiments, the planar topmost surface of the oxide material 16 is coplanar with a topmost surface of each semiconductor fin 14.

Figure 4:
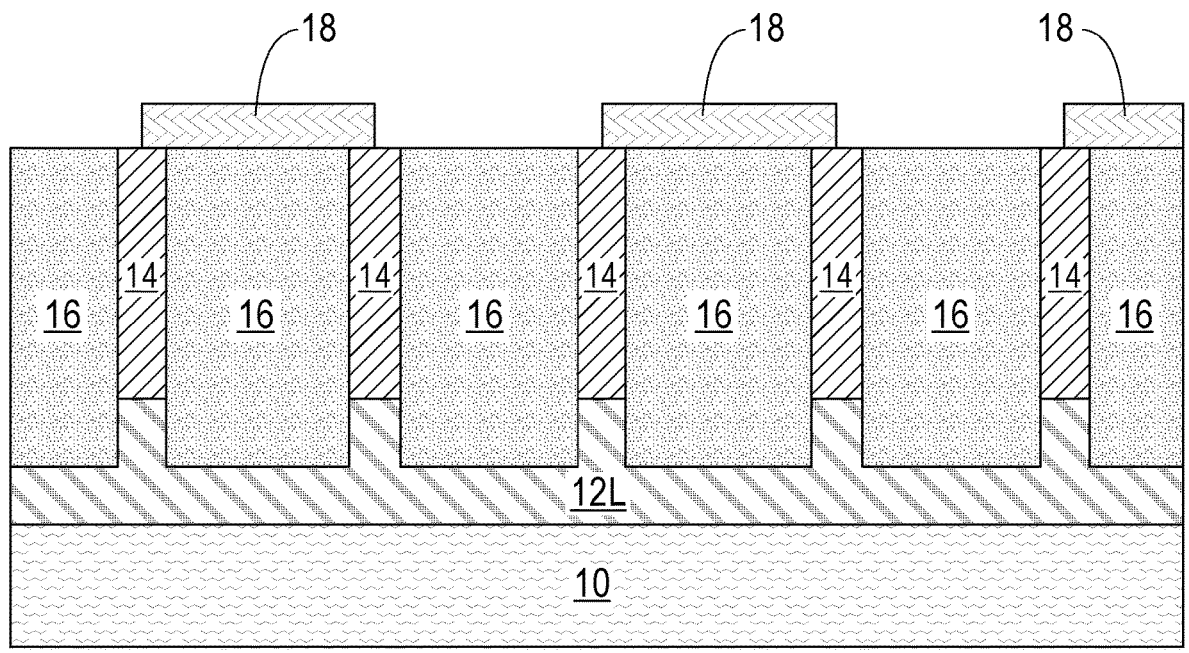
FIG. 4 is a cross sectional view of the exemplary structure of FIG. 3 after forming a dielectric hard mask over a predetermined number of oxide material filled gaps.

Referring now to FIG. 4, there is illustrated the exemplary structure of FIG. 3 after forming a dielectric hard mask 18 over a predetermined number of oxide material 16 filled gaps G1. In some embodiments, a single dielectric hard mask can be formed over one of the oxide material 16 filled gaps, G1. In the illustrated embodiment shown in FIG. 4, the dielectric hard masks 18 are formed over every other oxide material 16 filled gap, G1. As is shown, some of the oxide material 16 filled gaps, G, are not covered, i.e., protected, by a dielectric hard mask 18. The physically exposed oxide material 16 filled gap, G1, will be recessed in a later step of the present application.

The dielectric hard mask 18 covers an entirety of one of the oxide material 16, filled gaps, G1. In some embodiments and as is shown in FIG. 4, the dielectric hard mask 18 may be formed above a portion of a neighboring pair of semiconductor fins 14.

The dielectric hard mask 18 is composed of a dielectric hard mask material such as, for example, silicon nitride or silicon oxynitride, and is compositionally different from the oxide material 16. The dielectric hard mask 18 can be formed by a conventional deposition process and patterning. The patterning can include lithography and etching as defined above. The dielectric hard mask 18 can have a thickness from 20 nm to 100 nm; although other thicknesses are contemplated and can be used as the thickness of the dielectric hard mask 18.

Figure 5:
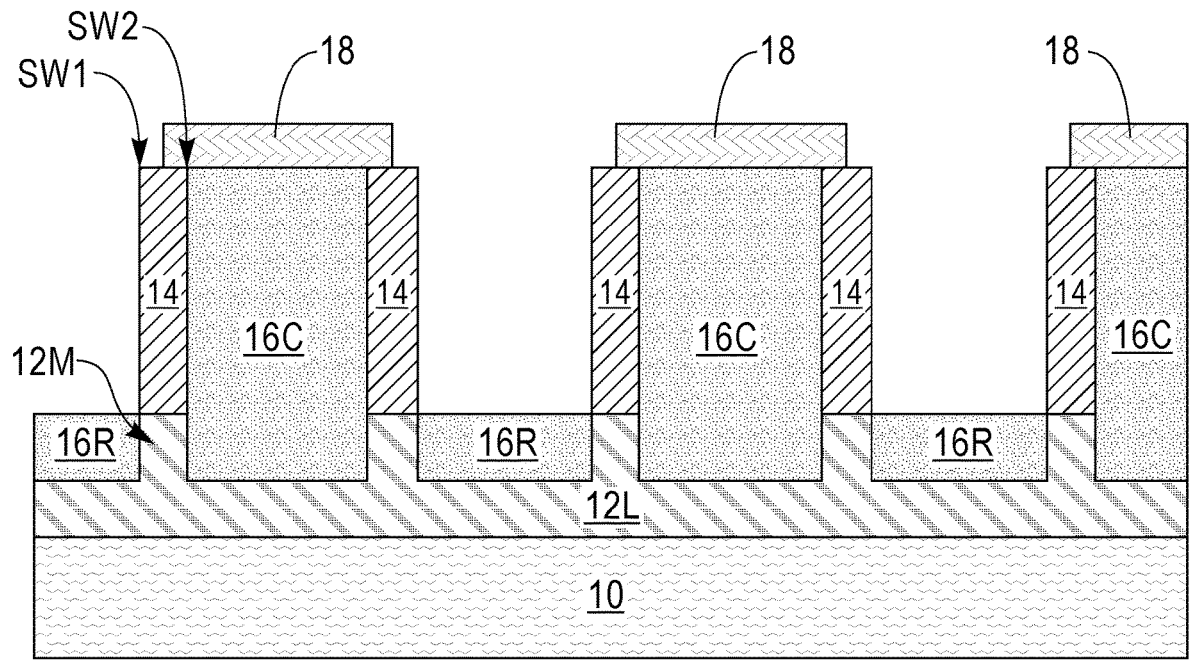
FIG. 5 is a cross sectional view of the exemplary structure of FIG. 4 after recessing the oxide material that is not protected by the dielectric hard masks.

Referring now FIG. 5, there is illustrated the exemplary structure of FIG. 4 after recessing the oxide material 16 that is not protected by the dielectric hard masks 18. The recessing of the oxide material 16 that is physically exposed, i.e., not protected by the dielectric hard masks 18, includes a recess etching process that is selective in removing oxide as compared to the dielectric hard masks 18.

After recessing of the oxide material 16 not protected by the dielectric hard mask 18, a recessed portion of the oxide material 16 remains in the some of the gaps, G1. The recessed portion of the oxide material 16 can be referred to herein as a local isolation region 16R. The local isolation region 16R is composed of oxide material 16. In some embodiments and as is shown in FIG. 5, the local isolation regions 16R have a topmost surface that substantially coplanar (i.e., within ±10%) with the topmost surface of the mesa portion 12M of the punch through stop semiconductor material layer 12L. The recessing performed at this step of the present application physically exposes a first sidewall, SW1, of a semiconductor fin 14; oxide material 16 remains on a second sidewall, SW2, of the semiconductor fin 14 that is opposite the first sidewall, SW1. The maintained oxide material 16 contacts a sidewalls of a nearest neighboring semiconductor fin 14. The oxide material 16 that is not subjected to the recess etch can be referred to herein as oxide charge storage region 16C. In some embodiments, the oxide charge storage region 16C is located between a neighboring pair of semiconductor fins 14. In such an embodiment, the oxide charge storage region 16C contacts facing sidewalls of the neighboring pair of semiconductor fins 14. In other embodiments in which a single semiconductor fin 14 is formed, the oxide charge storage region 16C is located on one side of the single semiconductor fin 14.

Figure 6A:
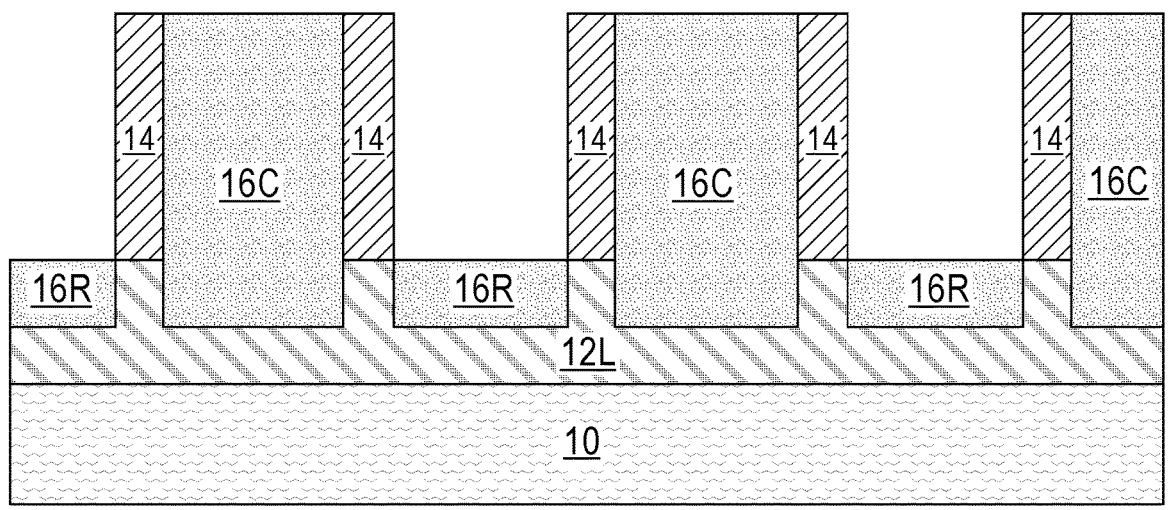
FIG. 6A is a cross sectional view of the exemplary structure of FIG. 5 after removing each dielectric hard mask.
Figure 6B:
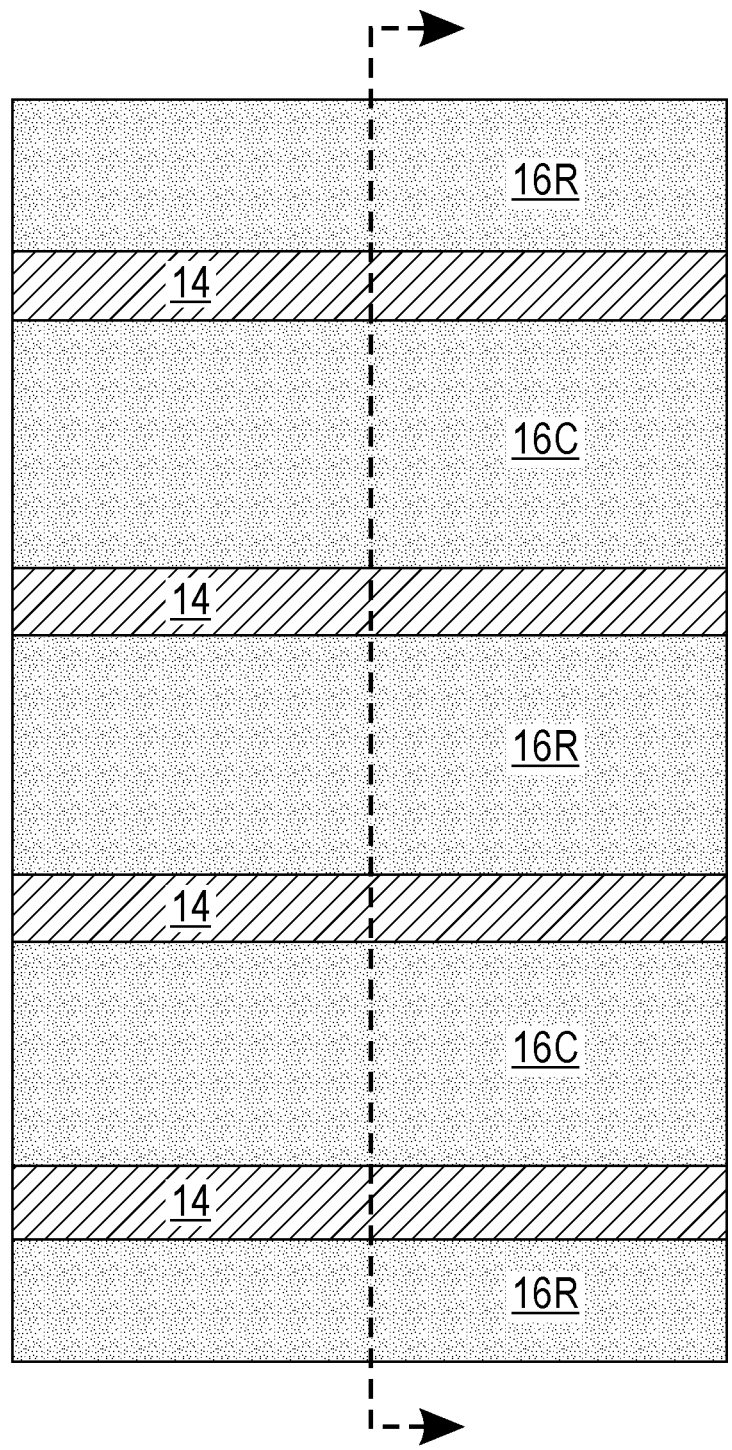
FIG. 6B is a top down view of a portion of the exemplary structure shown in FIG. 6A.

Referring now to FIG. 6A, there is illustrated the exemplary structure of FIG. 5 after removing each dielectric hard mask 18; in embodiments in which a hard mask cap is present on each of the semiconductor fins 14, the hard mask caps can be removed at this point of the present application. The removal of the dielectric hard mask 18 and, if present, the hard mask caps, can be performed utilizing a material removal process such as, for example, etching and/or planarization. After removing the dielectric hard masks 18, each oxide charge storage region 16C is physically exposed. FIG. 6B illustrates a top down view of a portion of the structure shown in FIG. 6A. The dotted line represents an area in which the cross sectional view shown in FIG. 6A is taken from.

At this point of the present application, a sacrificial gate structure (not shown) can be formed straddling over a portion of each of the semiconductor fins 14. The sacrificial gate structure lies perpendicular to each of the semiconductor fins 14. The sacrificial gate structure can be formed utilizing processes well known to those skilled in the art including deposition and patterning via lithography and etching. The sacrificial gate structure includes at least a sacrificial gate material such as, for example, polysilicon. A gate spacer (not shown) is then formed on the sidewalls of the sacrificial gate structure and straddling each of the semiconductor fins 14. The gate spacer can be formed by deposition and a spacer etch. The gate spacer is composed of a dielectric spacer material such as, for example, silicon dioxide.

At this point of the present application, epitaxial source/drain (S/D) regions (not shown) are then formed on physically exposed portions of the semiconductor fins 14 not including the sacrificial gate structure and gate spacer. As is known to those skilled in the art, a first epitaxial S/D region is formed on a first side of the sacrificial gate structure and a second epitaxial S/D region is formed on a second side of the sacrificial gate structure that is opposite the first side. The epitaxial S/D regions includes a semiconductor material, as defined above, for the base semiconductor substrate 10, and an n-type dopant or a p-type dopant, as also defined herein. The epitaxial S/D regions can be formed utilizing an epitaxial growth process as defined herein. The dopants present in the epitaxial S/D regions are typically introduced during the epitaxial growth process such that an in-situ doped semiconductor material is epitaxially grown on the physically exposed portions of the semiconductor fins 14 not protected by the sacrificial gate structure and gate spacer. An anneal may follow the epitaxial growth process to diffuse dopants from the epitaxial S/D regions into the underlying portions of the semiconductor fins 14.

A middle-of-the-line (MOL) dielectric material (not shown) can then formed over the epitaxial source/drain regions. The MOL dielectric material is composed of a dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material. The use of a self-planarizing dielectric material as the MOL dielectric material may avoid the need to perform a subsequent planarizing step. In one embodiment, the MOL dielectric material can be formed utilizing a deposition process including, for example, chemical vapor deposition (CVD), plasma enhanced chemical vapor deposition (PECVD), evaporation or spin-on coating. In some embodiments, a planarization process and/or an etch back process follows the deposition of the MOL dielectric material. The MOL dielectric material typically has a topmost surface that is coplanar with a topmost surface of the sacrificial gate structure.

Next, the sacrificial gate structure is removed forming a gate cavity that is located between the gate spacer. The removal of the sacrificial gate structure can include one or more etching processes such as, for example, reactive ion etching. The gate cavity physically exposes a portion of each semiconductor fin 14 that is positioned between the epitaxial S/D regions. The gate cavity also physically exposes portions of the local isolation region 16R and the oxide charge storage region 16C.

Figure 7:
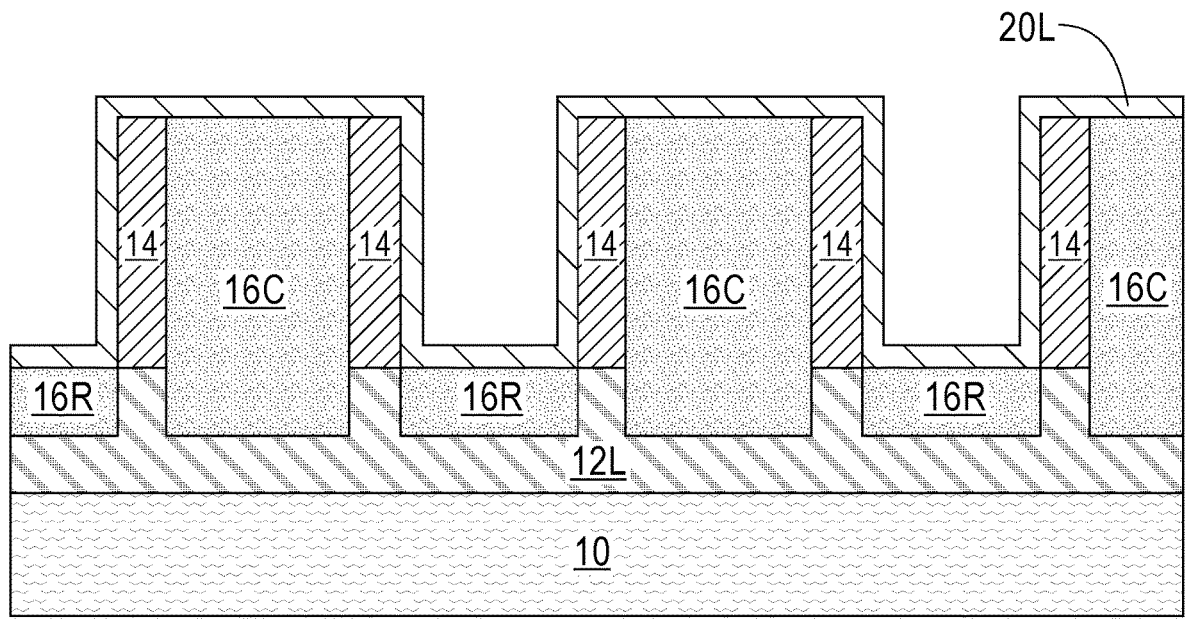
FIG. 7 is a cross sectional view of the exemplary structure of FIG. 6A after forming a gate dielectric material layer.

Referring now to FIG. 7, there is illustrated the exemplary structure of FIG. 6A after forming a gate dielectric material layer 20L. The gate dielectric material layer 20L is formed in the gate cavity mentioned above and on physically exposed surfaces of each local oxide region 16R, each semiconductor fin 14, and each oxide charge storage region 16C.

The gate dielectric material layer 20L is composed of a gate dielectric material. The gate dielectric material that provides the gate dielectric material layer 20L can be composed of an oxide, nitride, and/or oxynitride. In one example, the gate dielectric material that provides the gate dielectric material layer 20L can be composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure composed of different gate dielectric materials, e.g., silicon dioxide, and a high-k gate dielectric, can be formed and used as the gate dielectric portion.

The gate dielectric material layer 20L can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material layer 20L can have a thickness in a range from 1 nm to 10 nm. Other thicknesses that are lesser than, or greater than, the aforementioned thickness range can also be employed for gate dielectric material layer 20L.

Figure 8A:
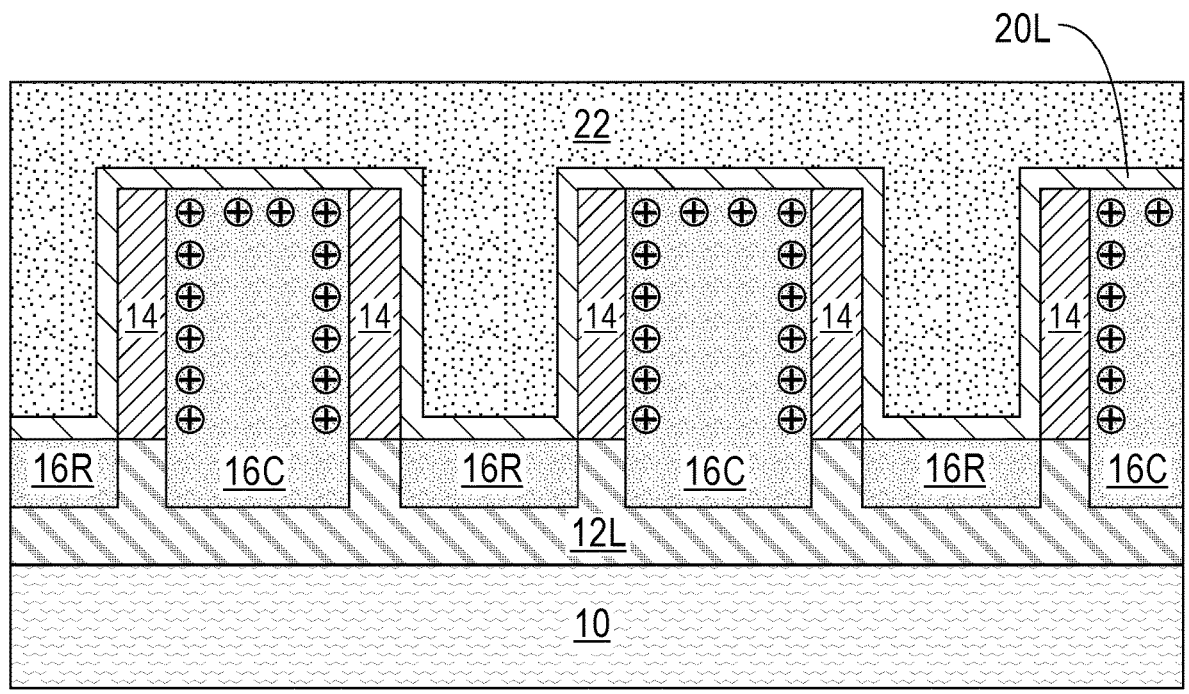
FIG. 8A is a cross sectional view of the exemplary structure of FIG. 7 after forming a gate conductor material layer.
Figure 8B:
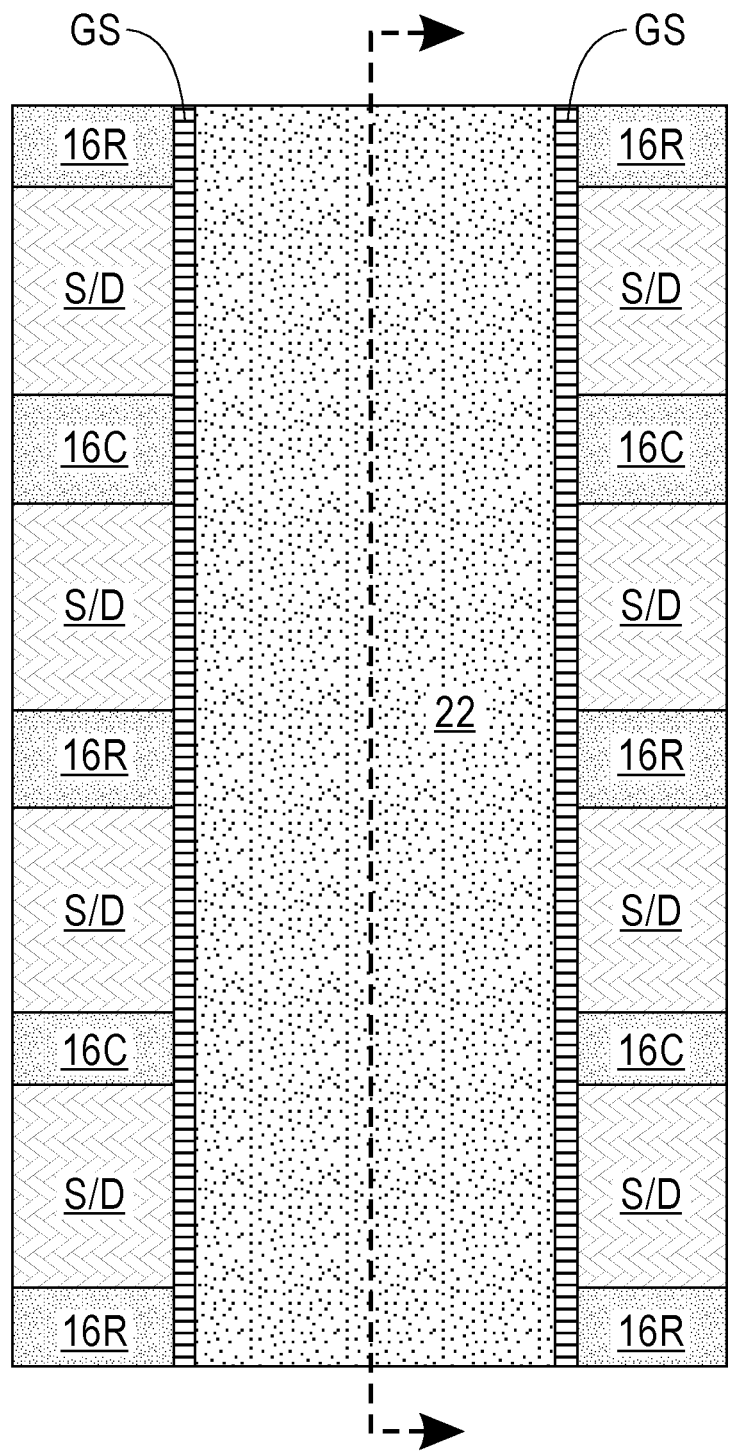
FIG. 8B is a top down view of a portion of the exemplary structure shown in FIG. 8A.

Referring now to FIG. 8A, there is illustrated the exemplary structure of FIG. 7 after forming gate conductor material layer 22; FIG. 8B illustrates a top down view of the exemplary structure shown in FIG. 8A. The gate conductor material layer 22 is formed in the gate cavity mentioned above and on physically exposed surface of the gate dielectric material layer 20L. Collectively, the gate dielectric material layer 20L and the gate conductor material layer 22 provide components of a functional gate structure. By "functional gate structure", it is meant a permanent gate structure that is used to control output current (i.e., flow of carriers in the channel) of a semiconducting device through electrical or magnetic fields. The functional gate structure is located on exposed surfaces of each semiconductor fin 14. A finFET device is thus provided in the gate cavity.

The gate conductor material layer 22 is composed of a gate conductor material. The gate conductor material used in providing the gate conductor material layer 22 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate conductor material layer 22 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. A planarization process can follow the deposition of the gate conductor material layer 22. In one embodiment, the gate conductor material layer 22 has a thickness from 50 nm to 150 nm. Other thicknesses that are lesser than, or greater than, the aforementioned thickness range can also be employed for the gate conductor material used in providing the gate conductor portion. The gate conductor material layer 22 has a topmost surface that is typically coplanar with a topmost surface of the MOL dielectric material (not shown).

Notably, FIGS. 8A and 8B illustrate a semiconductor radiation monitor (i.e., dosimeter) in accordance with an embodiment of the present application. The semiconductor radiation monitor includes a semiconductor fin 14 having a first sidewall and a second sidewall opposite the first sidewall, an oxide charge storage region 16C is located laterally adjacent to, and contacting, the first sidewall of the semiconductor fin, and a first portion of a functional gate structure (20L/22) is located laterally adjacent to, and contacting, the second sidewall of the semiconductor fin 14. In the illustrated embodiment, the oxide charge storage region 16C contacts a facing sidewall of a nearest neighboring semiconductor fin. In FIG. 8A, charges are shown as plus signs within a circle. In accordance with the present application, charges are created in the oxide charge storage region 16C on one side of a semiconductor fin 14 and detected on the other side of the same semiconductor fin 14 by the functional gate structure (20L/22). Multiple semiconductor fins 14 in parallel form a dense and very sensitive dosimeter structure.

Referring now to FIG. 8B, there is illustrated a top down view of a portion of the exemplary structure shown in FIG. 8A. The dotted line represents an area in which the cross sectional view shown in FIG. 8A is taken from. In FIG. 8B, the MOL dielectric material is not shown so as to highlight the epitaxial S/D regions, labeled as S/D, that are present on each side of the functional gate structure (20L/22). In FIG. 8B, the gate spacer is labeled as GS.

The exemplary dosimeter structure shown in FIGS. 8A-8B operates with the same detection mechanism as prior art FDSOI dosimeters with the following additional benefits. First, the dosimeter structure of the present application has a tighter device density (i.e., larger surface area) from dual sides of the functional gate structure channels (i.e., one gate side-one sensing side). Secondly, the dosimeter structure of the present application is potentially capable of detecting lower radiation dose (equal to, or less than, 100 Rad) which is critical for use as a personal dosimeter. In some embodiments, the lower radiation dose detection can be provided by suitable engineering of the oxide quality (e.g., by ion implanting the oxide material 16 with silicon ions, oxygen ions, hydrogen ions, or argon ions, or by using a low temperature (less than 400° C.) deposition) which is difficult in an FDSOI dosimeter without risking damaging of the semiconductor channel. In other embodiments, the vertical height of the semiconductor fins and the oxide material can be designed to provide enhanced charge sensitivity. Thirdly, the dosimeter structure of the present application does not require the use of a high cost SOI substrate.

The dosimeter structure shown in FIGS. 8A-8B provides instantaneous readout of a radiation dose through simple electrical measurement (wired or wireless) as compared to a conventional thermoluminescene dosimeter which requires extended post-radiation sample process. Also, the dosimeter structure shown in FIGS. 8A-8B provide direct $\Delta V_{th}$ measurement by simple I-V or C-V measurement for radiation dose calculation. The fabrication of the dosimeter structure shown in FIGS. 8A-8B is CMOS processing compatible and requires no new processes to be developed, which facilitates device scaling with advantages such as embedded/implantable applications. In commercial RADFET's, support electronics are required to maintain specific currents/voltages for $\Delta V_{th}$ readouts. These readouts contain a component dependent on the biasing current, which limits device scalability.

Furthermore, the inter-channel/sheet oxide structure shown in FIG. 8A decouples the charge storage part from the radiation detection/readout (front gate/SOI MOSFET or Capacitor), which enables non-destructive electrical readout. In bulk-Si dosimeter (e.g., RADFET, a p-type MOSFET) the radiation detection is conducted in the front gate/oxide/Si where the charge is stored. The repetitive readout voltage (negative for p-MOSFET) may eventually induce leakage of stored charge (tunneling, detrapping, etc). In addition, the dosimeter structure shown in FIGS. 8A-8B can provide long (compared to radiation treatment time) charge retention time (at least 30 days), enabling long-term radiation dose tracking.

Figure 9:
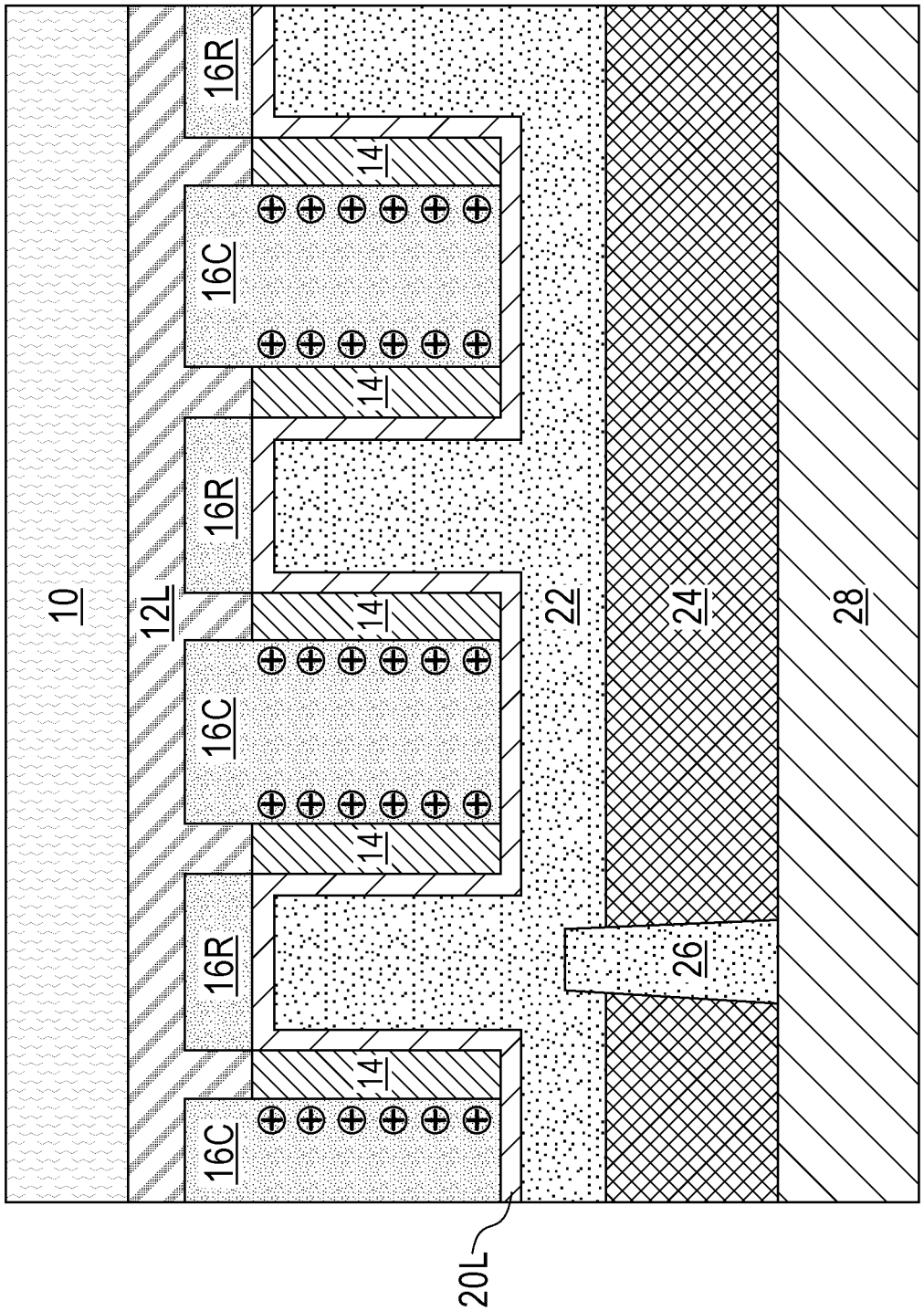
FIG. 9 is a cross sectional view of the exemplary structure of FIG. 8A after forming an interlayer dielectric (ILD) material layer containing at least one metal-containing contact structure embedded therein which contacts a surface of the gate conductor layer, and bonding the ILD material layer to a handle substrate.
Figure 10:
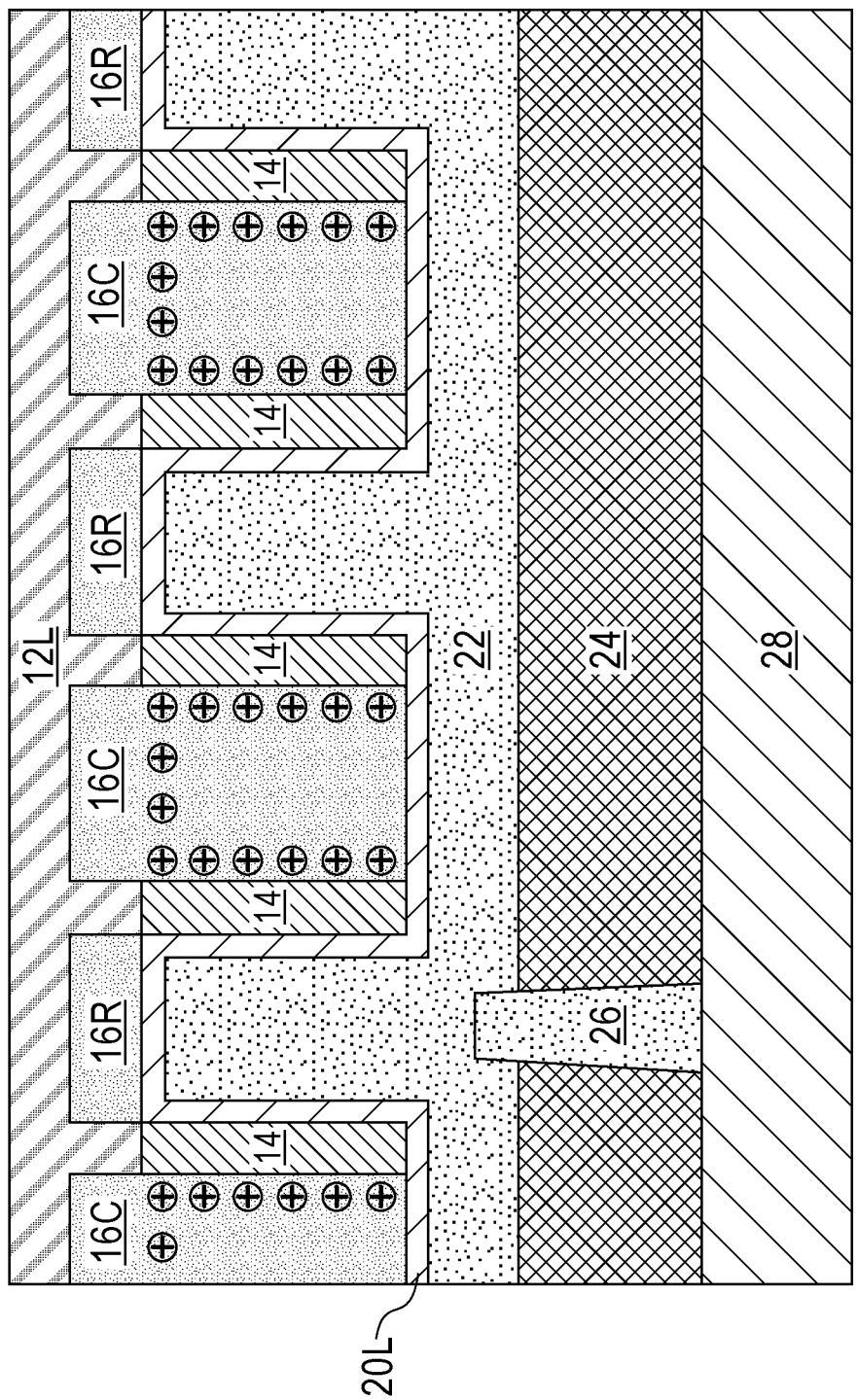
FIG. 10 is a cross sectional view of the exemplary structure of FIG. 9 after removing the base semiconductor substrate to expose a surface of the PTS semiconductor material layer.

In some embodiments of the present application, the exemplary dosimeter structure shown in FIG. 8A can be further processed as shown in FIGS. 9 and 10 to reduce and, in some cases, eliminate, the shadowing effect of the gate and the contacts. Referring first to FIG. 9, there is illustrated the exemplary structure of FIG. 8A after forming an interlayer dielectric (ILD) material layer 24 containing at least one metal-containing contact structure 26 embedded therein which contacts a surface of the gate conductor layer 22 and bonding the interlayer dielectric (ILD) material layer 24 to a handle substrate 28. It is noted that the exemplary structure shown in FIG. 9 is rotated 180° as compared to the exemplary structure shown in FIG. 8A.

The ILD material layer 24 may include one of the dielectric materials mentioned above for the MOL dielectric material. The ILD material layer 24 can be formed utilizing a conventional deposition such as for example, chemical vapor deposition (CVD), plasma enhanced chemical vapor deposition (PECVD) or spin-on coating. The ILD material layer 24 can have a thickness from 50 nm to 500 nm; although other thicknesses for the ILD material layer 24 are possible and can be used in the present application.

After forming the ILD material layer 24, at least one metal-containing contact structure 26 is formed into the ILD material layer 24 and contacting a surface of the gate conductor layer 22. The at least one least one metal-containing contact structure 26 can be formed by first providing a contact opening (not shown) in the ILD material 24. The contact opening extends to a surface of the gate conductor layer 22. In some embodiments, the contact opening extends partially into the gate conductor layer 24. A contact material such as for example, tungsten (W), cobalt (Co), platinum (Pt), nickel (Ni) or alloys thereof, is then formed into the contact opening. Prior to forming the contact material, a diffusion barrier material such as, for example, Ta, TaN, Ti, TiN, Ru, RuN, RuTa, RuTaN, W, or WN can be formed into the contact opening. The contact material and diffusion barrier material can be formed utilizing conventional deposition processes well known to those skilled in the art. A planarization process such as, for example, chemical mechanical polishing and/or grinding, can then be used to remove any contact material and, if present, the diffusion barrier material that is present outside the contact opening, while maintaining the contact material and, if present, the diffusion barrier material in the contact opening. The remaining contact material provides a metal-containing contact structure 26, while the remaining diffusion barrier provides a diffusion barrier liner (not shown). The diffusion barrier liner would be located along the sidewalls and bottom wall of the metal-containing contact structure 26.

The ILD material layer 24 containing the embedded metal-containing contact structure 26 that is formed on the exemplary structure shown in FIG. 8A can be bonded to a surface of handle substrate 28, as is shown in FIG. 9. In some embodiments, handle substrate 28 is composed of a semiconductor material and/or an insulator layer such as, for example, silicon dioxide. The bonding is performed utilizing any conventional bonding process that is well known to those skilled in the art. In one example, the bonding process includes a plasma activated wafer bonding process, which needs no annealing or only a low temperature, less than 200° C., anneal.

Referring now to FIG. 10, there is illustrated the exemplary structure of FIG. 9 after removing the base semiconductor substrate 10 to expose a surface of the PTS semiconductor material layer 12L. The base semiconductor substrate 10 can be removed utilizing any conventional material removal process including, for example, etching or planarization.

In the various embodiments mentioned herein, a semiconductor radiation monitor (i.e., dosimeter) is provided that has an oxide charge storage region 16C located on a first side of a semiconductor fin 14 and a functional gate structure (20L/22) located on a second side of the semiconductor fin 14 that is opposite the first side. Charges are created in the oxide charge storage region 16C that is located on the first side of the semiconductor fin 14 and detected on the second side of the semiconductor fin 14 by the functional gate structure (20L/22). The finFET radiation monitor of the present application is capable of real time readout, with retention, and can detect a low dose of radiation (equal to, or less than, 100 Rad).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor radiation monitor comprising:
   a semiconductor fin having a first sidewall and a second sidewall opposite the first sidewall, wherein the semiconductor fin is located on a mesa portion of a punch through stop semiconductor material layer;
   an oxide charge storage region located laterally adjacent to, and contacting, the first sidewall of the semiconductor fin; and
   a first portion of a functional gate structure located laterally adjacent to, and contacting, the second sidewall of the semiconductor fin.

2. The semiconductor radiation monitor of claim 1, wherein the punch through stop semiconductor material layer is located on a surface of a base semiconductor substrate.

3. The semiconductor radiation monitor of claim 1, further comprising an interlayer dielectric (ILD) material layer located on the functional gate structure, wherein the ILD material layer contains a metal-containing contact structure embedded therein that contacts a surface of the functional gate structure.

4. The semiconductor radiation monitor of claim 1, further comprising a local isolation region located laterally adjacent to, and contacting, the mesa portion of the punch through stop semiconductor material layer.

5. The semiconductor radiation monitor of claim 4, wherein the local isolation region and the oxide charge storage region are composed of a same oxide material.

6. The semiconductor radiation monitor of claim 1, wherein the functional gate structure extends above the semiconductor fin and the oxide charge storage region.

7. The semiconductor radiation monitor of claim 1, further comprising another semiconductor fin spaced apart from the semiconductor fin, wherein the another semiconductor fin has a first sidewall and a second sidewall opposite the first sidewall, wherein the oxide charge storage region is located laterally adjacent to, and contacting, the first sidewall of the another semiconductor fin, and a second portion of the functional gate structure is located laterally adjacent to, and contacting the second sidewall of the another semiconductor fin.

8. The semiconductor radiation monitor of claim 7, wherein the another semiconductor fin is located on another mesa portion of the punch through stop semiconductor material layer.

9. The semiconductor radiation monitor of claim 8, wherein the punch through stop semiconductor material layer is located on a surface of a base semiconductor substrate.

10. The semiconductor radiation monitor of claim 8, further comprising an interlayer dielectric (ILD) material layer located on the functional gate structure, wherein the ILD material layer contains a metal-containing contact structure embedded therein that contacts a surface of the functional gate structure.

11. A semiconductor radiation monitor comprising:
- a semiconductor fin having a first sidewall and a second sidewall opposite the first sidewall;
- an oxide charge storage region located laterally adjacent to, and contacting, the first sidewall of the semiconductor fin; and
- a first portion of a functional gate structure located laterally adjacent to, and contacting, the second sidewall of the semiconductor fin, wherein the functional gate structure extends above the semiconductor fin and the oxide charge storage region.

* * * * *